(12) United States Patent
Geissler

(10) Patent No.: US 7,793,185 B2
(45) Date of Patent: Sep. 7, 2010

(54) INTEGRATED CIRCUIT FOR A DATA TRANSMISSION SYSTEM AND RECEIVING DEVICE OF A DATA TRANSMISSION SYSTEM

(75) Inventor: Richard Geissler, Weissenhorn (DE)

(73) Assignee: Atmel Automotive GmbH, Heilbronn (DE)

( * ) Notice: Subject to any disclaimer, the term of this patent is extended or adjusted under 35 U.S.C. 154(b) by 367 days.

(21) Appl. No.: 11/850,639

(22) Filed: Sep. 5, 2007

(65) Prior Publication Data
US 2009/0019331 A1 Jan. 15, 2009

Related U.S. Application Data

(60) Provisional application No. 60/842,045, filed on Sep. 5, 2006.

(51) Int. Cl.
*G01R 31/28* (2006.01)
(52) U.S. Cl. .................... 714/733; 714/734
(58) Field of Classification Search ............ None
See application file for complete search history.

(56) References Cited

U.S. PATENT DOCUMENTS

| 6,807,644 | B2* | 10/2004 | Reis et al. .......... 714/724 |
| 7,032,151 | B2* | 4/2006 | Halder et al. ......... 714/740 |
| 7,457,987 | B2* | 11/2008 | Franco et al. ........ 714/32 |
| 7,519,884 | B2* | 4/2009 | Whetsel .............. 714/726 |

* cited by examiner

*Primary Examiner*—Christine T Tu
(74) *Attorney, Agent, or Firm*—Muncy, Geissler, Olds & Lowe, PLLC

(57) ABSTRACT

The invention relates to an integrated circuit for a data transmission system comprising a) a plurality of functional units, b) a TAP controller, according to IEEE 1149, having a JTAG interface, and c) a test unit for testing the functionality of the functional units, whereby the test unit has at least two operating modes and at least one gate terminal for switching between the operating modes and is designed to connect circuit points, assigned to a specific operating mode, of the functional units to terminals of the integrated circuit, when the test unit is operated in the specific operating mode. According to the invention, the at least one gate terminal of the test unit is connected to the TAP controller and the integrated circuit is designed to switch between the operating modes depending on the internal states of the TAP controller. The invention relates furthermore to a receiving device of a data transmission system.

17 Claims, 2 Drawing Sheets

INTEGRATED CIRCUIT FOR A DATA TRANSMISSION SYSTEM AND RECEIVING DEVICE OF A DATA TRANSMISSION SYSTEM

This nonprovisional application claims priority to U.S. Provisional Application No. 60/842,045, which was filed on Sep. 5, 2006, and is herein incorporated by reference.

BACKGROUND OF THE INVENTION

1. Field of the Invention

The present invention relates to an integrated circuit for a data transmission system. The invention relates furthermore to a receiving device of a data transmission system.

2. Description of the Background Art

The invention falls within the field of integrated semiconductor circuits (integrated circuit, IC) for data transmission systems, such as, e.g., satellite-based positioning systems (GPS, Galileo, etc.), digital radio and television systems (DRM, DAB, DVB, etc.), mobile communications systems (GSM, UMTS, DECT, WiMax, WLAN, WPAN, etc.), or hard-wired communication systems (Ethernet, ISDN, etc.). It falls particularly within the field of complex integrated circuits, which have a plurality of functional units, such as memory units, interface units, monitoring units, decoders, etc., as well as within the field of the testing of these functional units for their functionality.

Prior-art integrated circuits frequently have a JTAG interface (Joint Test Action Group), standardized according to IEEE 1149, and a so-called TAP controller (test access port) for processing JTAG signals. This makes it possible to check, for example, a microcontroller for its proper operation by running program instructions step by step and interactively (debugging).

To be able to test functional units efficiently for their functionality by the manufacturer of integrated circuits as part of production error tests, prior-art integrated circuits have in addition a test unit, which can be operated in different operating modes. Depending on the operating mode, the test unit connects a plurality of circuit points, each assigned to the operating mode, of the functional units to certain terminals of the integrated circuit. In this way, test signals generated outside the integrated circuit can be applied in a test operating mode directly to circuit points of the functional units, which cannot be influenced externally in the normal operating mode. In addition, signals of the functional units, which cannot be picked up at the terminals of the integrated circuit in the normal operating mode, can be provided at the terminals of the integrated circuit in this way in the test operating mode. Because no additional terminals (pins) on the integrated circuit need to be provided for such error tests, terminals of the integrated circuit, which are also used in the normal operating mode, e.g., for "normal" output signals, are typically used in the test operating mode for the test signals.

It is made possible in this way to efficiently test a plurality of functional units for their functionality, i.e., within a relatively short time period, by placing the test unit successively in different test operating modes; consequently, different signal paths, assigned to the specific mode, within one or more functional units are successively connected to the terminals of the integrated circuit, so that test signals can be supplied at these terminals and the resulting signals can be picked up to test the correctness. The test unit has at least one gate terminal for switching between the operating modes.

It is a disadvantage in this case that for controlled switching of the test unit between operating modes at least one additional separate terminal on the integrated circuit must be provided, which makes the realization of the integrated circuit more time-consuming and thereby more costly. Another disadvantage is that the functionality of the functional units can no longer be tested when the integrated circuit is mounted on a printed circuit board, because the terminals for switching the operating mode are not typically extended to the printed circuit board and therefore cannot be supplied with the appropriate control signals.

SUMMARY OF THE INVENTION

It is therefore an object of the present invention to provide an integrated circuit of the aforementioned type, which is simple and cost-effective to realize and makes it possible to test efficiently the functionality of the functional units at each stage and moreover requires no separate terminals, specifically dedicated for this purpose, for switching the operating mode of the test unit.

The integrated circuit of the invention for a data transmission system comprises a) a plurality of functional units, b) a TAP controller, according to IEEE 1149, having a JTAG interface, c) a test unit for testing the functionality of the functional units, whereby the test unit has at least two operating modes and at least one gate terminal for switching between the operating modes and is designed to connect circuit points, assigned to a specific operating mode, of the functional units to terminals of the integrated circuit, when the test unit is operated in the specific operating mode, whereby d) the at least one gate terminal of the test unit is connected to the TAP controller, and e) the integrated circuit is designed to switch between the operating modes, depending on the internal states of the TAP controller.

The receiving device of a data transmission system, according to the invention, has at least one such integrated circuit.

The substance of the invention is to connect the at least one gate terminal of the test unit to the TAP controller and to switch between operating modes depending on the internal states of the TAP controller.

This makes it possible to control the test unit via the present JTAG interface of the integrated circuit, so that no dedicated terminals need to be provided on the integrated circuit to switch the operating mode of the test unit. In addition, the functionality of the functional units can be checked not only as part of production error tests at the IC manufacturer, but advantageously also as part of application tests at the customer, after the integrated circuit is mounted on the printed circuit board.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
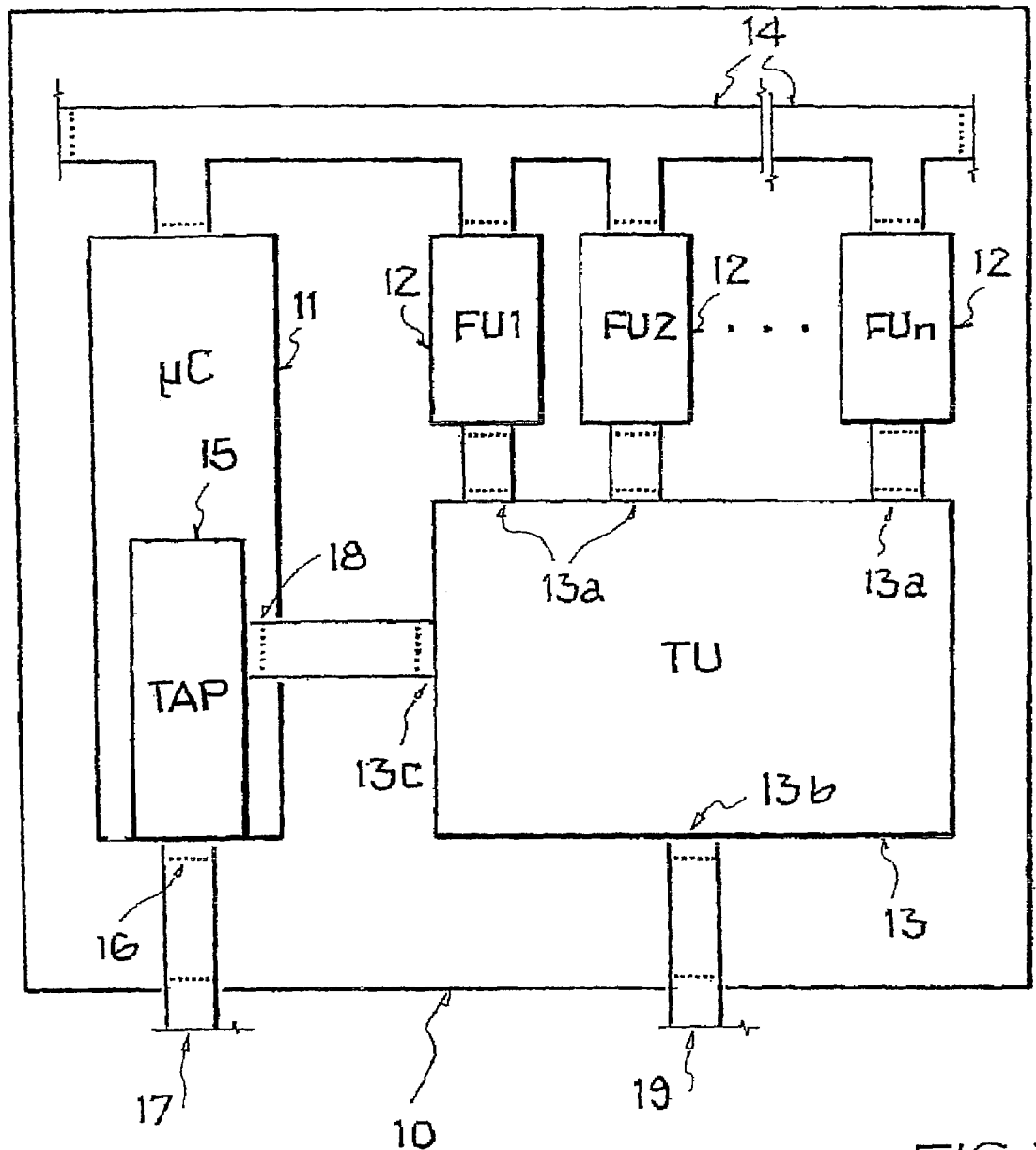
FIG. 1 illustrates an exemplary embodiment of an integrated circuit of the invention.

In the figures, the same and functionally identical elements and signals, if not specified otherwise, are provided with the same reference characters.

FIG. 1 shows a block diagram of an exemplary embodiment of an integrated circuit according to the invention for a data transmission system.

The integrated circuit (IC) 10 has a microcontroller (μC) 11, a plurality of functional units (FU1, FU2, . . . , FUn) 12, a test unit (TU) 13 for testing the functionality of functional units 12, and a plurality of terminals 17, 19. In addition, the integrated circuit may have other units and other terminals, which are not shown in FIG. 1.

Functional units 12 comprise, for example, memory units (RAM, ROM, EPROM, flash memory, etc.), interface units (USB, UART, interfaces for memory management, etc.), monitoring units (e.g., for voltage monitoring), decoder, arbiter, or analogous units (oscillators, phase-locked loops, etc.). In this case, each functional unit 12 may have one of these units or several units connected to one another. Furthermore, functional units can also be connected directly to one another and/or to units outside the integrated circuit.

Microcontroller 11 controls functional units 12 via a bus 14. In other exemplary embodiments (not shown), the functional units are linked via several different bus systems, e.g., via a high- and low-speed bus to microcontroller 11. Moreover, individual or all functional units 12 can be uncontrolled and therefore not directly connected to microcontroller 11.

Microcontroller 11, which is designed, for example, as an ARM7 processor, has for testing its proper function, i.e., for debugging the program steps it executes, a TAP controller 15, standardized according to IEEE 1149, with a JTAG interface 16 for applying and picking up JTAG signals, whereby the abbreviation TAP stands for "test access port" and JTAG for "Joint Test Action Group."

TAP controller 15 has a state machine, which, depending on the applied JTAG signals, can assume a total of 16 different internal states (IEEE 1149). The JTAG interface (JTAG port), at times also called a TAP interface, comprises two terminals TDI, TDO for test data (test data input or test data output) and two to three terminals for control signals (test clock, test mode select, and optionally test reset).

For functionality tests, a JTAG interface 17 of integrated circuit 10, said interface connected to JTAG interface 16 of TAP controller 15, is connected via a JTAG adapter (not shown) to a computer (also not shown), with whose help input test data are generated and applied to the TDI terminal of JTAG interface 17 and the output test data, generated by integrated circuit 10 on the basis of the input test data and provided at the TDO terminal of JTAG interface 17, are evaluated.

Test unit 13 is connected via a plurality of terminals 13a to functional units 12, via terminals 13b to terminals 19 of integrated circuit 10, and via at least one gate terminal 13c to TAP controller 15 of microcontroller 11. Terminals 13a, 13b, and 19 hereby preferably have both input and output terminals.

Test unit 13 can be operated in several but at least two operating modes, in which it connects the circuit points, assigned to the specific mode, of functional units 12 to terminals 19 of integrated circuit 10 in such a way that mode-dependent different signal paths are connected, which extend, e.g., from terminals 19, functioning as inputs, partially or completely through one (or several) functional units 12 to be tested in the specific mode to terminals 19, functioning as outputs, of integrated circuit 10. The term "circuit points" is hereby taken to mean, e.g., circuit nodes, but also any contact points and contact areas of or on lines, terminals, inputs and outputs, etc., of the functional units, i.e., any circuit network, which is present in a drawing of integrated circuit 10 as a circuit diagram.

Figure 3:
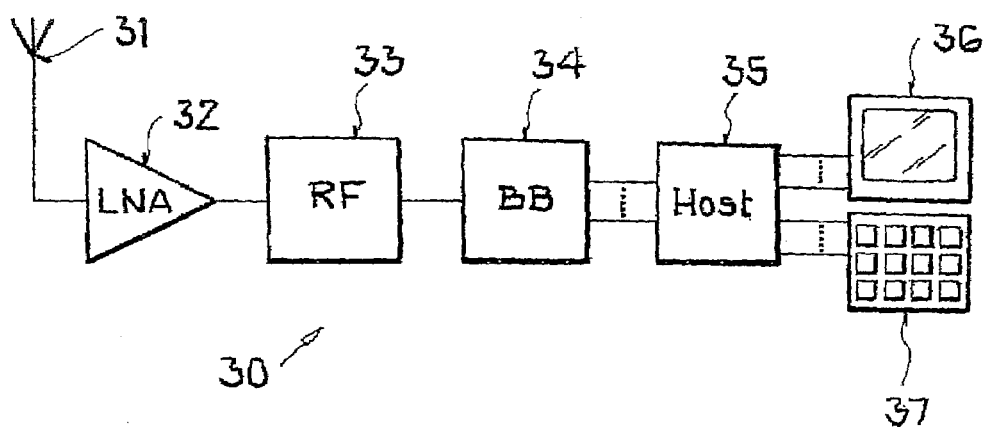
FIG. 3 illustrates a an exemplary embodiment of a receiving device of the invention.

Preferably, test unit 13 in a (normal) operating mode MO connects the circuit points S0, assigned to this mode, of functional units 12 to terminals 19 in such a way that integrated circuit 10 senses its specified "normal" function and, for example, determines the position of the receiver from an incoming GPS signal, applied at input terminals 19, and provides it at output terminals 19 (also see the following description with regard to FIG. 3). This operating mode MO is also called the reset mode of test unit 13.

In each of the different (test) operating modes M1, M2, M3, . . . , test unit 13, in contrast, connects circuit points S1, S2, or S3, assigned to the specific mode, of functional units 12 to terminals 19 in such a way that between input and output terminals 19 signal paths arise, which enable a partial or complete testing of one or more functional units 12, in that test signals are applied at input terminals 19 and the resulting signal is picked up at output terminals 19, compared with desired signals, and evaluated. Individual (or additional) test signals can hereby be supplied to the specific circuit points via terminals 17,16, 18, 13c, and 13a.

For example, in a first (test) operating mode M1, a functional unit 12, configured as a USB interface, can be checked for production errors, in that test unit 13 connects input terminals 19 with the scan-in and scan-enable terminals of the USB interface and at least one output terminal 19 to at least one scan-out output of the USB interface. The indicated inputs and outputs of the USB interface (scan-in, scan-enable, scan-out) in this case correspond to the circuit points S1 assigned to mode M1. Production test can be applied in this way according to the scan-test method.

In a second (test) operating mode M2, e.g., a memory unit 12 can be tested in that test unit 13 connects an input terminal 19 to the BIST-enable input (built-in self-test) of the memory unit and an output terminal 19 to the BIST-result output of the memory unit. In this case, the terminals BIST-enable and BIST-result of the memory unit correspond to circuit points S2 assigned to mode M2.

To switch between the different operating modes M0, M1, . . . , test unit 13 has at least one gate terminal 13c, connected to TAP controller 15. The switching between the different operating modes M0, M1, . . . occurs hereby depending on the internal states of TAP controller 15, as is explained in greater detail hereafter with reference to FIG. 2.

This makes it possible to control test unit 13 via JTAG interface 17 of integrated circuit 10 and TAP controller 15 in that, e.g., by means of a JTAG adapter, JTAG signals are applied at JTAG interface 17, which are suitable for transferring TAP controller 15 to internal states that enable switching of the operating mode. If JTAG interface 17, e.g., is supplied with JTAG signals J1 (or J2), which are assigned to the index-equivalent operating mode M1 (or M2), then this causes a switching of test unit 13 to operating mode M1 (M2) and thereby a running of the test unit in this mode M1 (M2). The JTAG signals J1, J2, . . . , e.g., have a bit sequence identifying the particular operating mode M1, M2, . . . .

Dedicated terminals for switching the operating mode of test unit 13 are therefore not required in integrated circuit 10, which is why the integrated circuit can be implemented at low cost and effort.

The functionality of functional units 12 can be checked in this manner not only as part of production error tests, but advantageously also as part of application tests, i.e., when the integrated circuit is mounted on a printed circuit board, because the JTAG interface is typically extended to the printed circuit board.

In additional exemplary embodiments, not shown in FIG. 1, the TAP controller is disposed outside the microcontroller in the integrated circuit and/or in fact a TAP controller but no microcontroller is provided in the integrated circuit.

Figure 2:
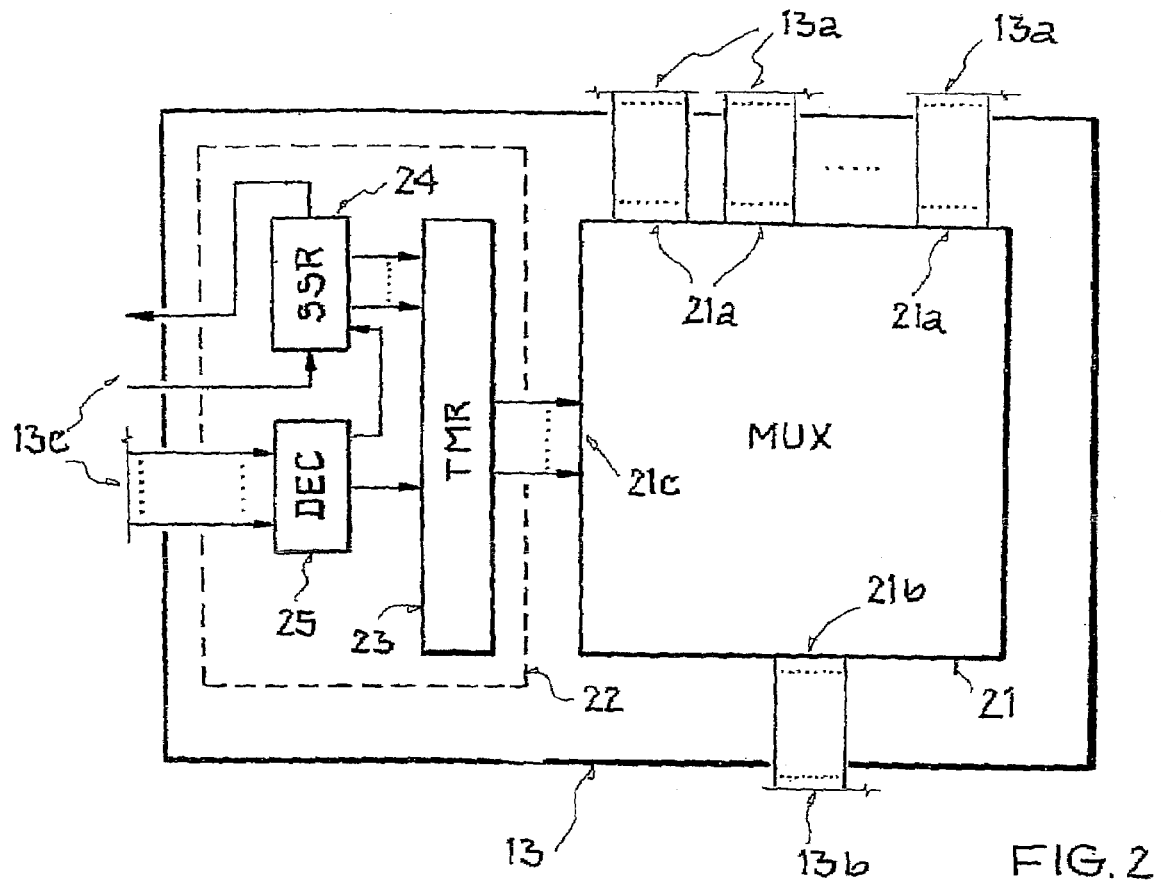
FIG. 2 illustrates an exemplary implementation of the test unit of FIG. 1.

FIG. 2 shows a circuit diagram of an exemplary implementation of the test unit of FIG. 1.

Test unit 13 has a multiplexer 21 for controllable connection of specific circuit points of functional units 12 to terminals 19 and a control unit 22 for driving multiplexer 21 depending on the internal states of TAP controller 15 (FIG. 1).

Multiplexer 21 has terminals 21a, which are connected via terminals 13a of test unit 13 to functional units 12 and terminals 21b, which are connected via terminals 13b of test unit 13 to terminals 19 of integrated circuit 10. In addition, multiplexer 21 has gate terminals 21c connected to control unit 22.

Control unit 22 is connected via gate terminals 21c to multiplexer 21 and via gate terminals 13c of test unit 13 to TAP controller 15.

Control unit 22 has a mode register 23 (test mode register, TMR) connected to gate terminals 21c of the multiplexer for storing a bit sequence assigned to (and identifying) the desired operating mode M0, M1, . . . . In addition, control unit 22 comprises a shift register 24 (scan shift register, SSR) connected to TAP controller 15 and mode register 23, for the serial loading of this bit sequence and a decoder (DEC) 25, connected to TAP controller 15, shift register 24, and mode register 23, for receiving the internal states of TAP controller 15.

As explained above with reference to FIG. 1, the control (configuration, programming) of test unit 13 occurs via TAP controller 15, which has a state machine with 16 states and is controlled via JTAG interface 17 of integrated circuit 10. When the state machine of TAP controller 15 is in a first predefined (specific) state of the 16 possible internal states and other memory units of TAP controller 15 assume predefined values, decoder 25 via an enable signal enables shift register 24 to be loaded serially with the aforementioned bit sequence and optionally with additional data via the data input TDI of JTAG interface 17 and one of terminals 18. If the state machine of TAP controller 15 is brought later in a second (different) predefined internal state, then decoder 25 instructs mode register 23 to take up the data of shift register 24 "en bloc", i.e., parallel. Depending on the content of mode register 23, in which the bit sequence identifying the desired operating mode is now stored, multiplexer 21 connects a plurality of connecting lines between terminals 21a or functional units 12 and terminals 21b or terminals 19 of integrated circuit 10. In the reset state of mode register 23, the connections, necessary for the normal operating mode M0, of functional units 12 are connected to terminals 19.

It is clear from these explanations that control unit 22 from the standpoint of TAP controller 15 behaves as a scan chain.

Furthermore, it is clear from the above statements that if need be when TAP controller 15 assumes two predefined internal states, a switching between operating modes is possible, whereby switching to a desired operating mode occurs only when other conditions are met. It can be provided in further embodiments, that switching is possible only when more than two predefined internal states are assumed.

It can be provided in further embodiments that in mode register 23, apart from the desired operating mode, other data are stored with which individual input terminals 21a can be driven directly.

In other embodiments, not shown in FIG. 2, the control unit is disposed completely or partially outside the test unit and/or is completely or partially a component of the microcontroller and/or of the TAP controller.

FIG. 3 shows a block diagram of an exemplary embodiment of a receiving device, according to the invention, of a GPS data transmission system for satellite-supported position sensing.

Receiving device 30 comprises an antenna 31 and a series connection, connected to the antenna, of a low-noise amplifier (LNA) 32, an integrated high-frequency circuit (RF) 33, an integrated baseband circuit (BB) 34, and an integrated host circuit 35, as well as a display 36, connected to the host circuit, and a keyboard 37.

The GPS signal, received from antenna 31, is first amplified with the use of amplifier 32 and then converted in high-frequency circuit 33 to an intermediate frequency signal. Baseband circuit 34 obtains position data of receiving device 30 from this intermediate frequency signal and relays these to host circuit 35, which shows the position data on display 36 and receives commands entered by the user via keyboard 37.

Baseband circuit 34 is preferably the integrated circuit described above with reference to FIGS. 1 and 2, whereby, e.g., terminals 19, shown in FIG. 1, of integrated circuit 10 correspond to the input and output terminals of baseband circuit 34, shown in FIG. 3.

Baseband circuit 34 is connected, for example, via a proprietary interface to high-frequency circuit 33 and via an USB interface to host circuit 35, whereby these interface units each correspond to a functional unit 12 shown in FIG. 1.

Although the present invention was described above with reference to exemplary embodiments, it is not limited thereto but can be modified in many ways. Thus, for example, the invention is not limited either to GPS receiving devices or GPS ICs, or to baseband ICs. The invention is also not limited to the provided embodiments of functional units, the test unit, etc. The invention can be used advantageously in fact in highly diverse wireless or hard-wired digital communication systems.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. An integrated circuit for a data transmission system, the integrated circuit comprising
a plurality of functional units;
a TAP controller having a JTAG interface; and
a test unit for testing a functionality of the functional units, the test unit having at least two operating test modes and at least one gate terminal for switching between operating test modes and is designed to connect circuit points assigned to a specific operating mode of the functional units to terminals of the integrated circuit when the test unit is operated in a specific operating test mode,
wherein the at least one gate terminal of the test unit is connected to the TAP controller, and wherein the integrated circuit is designed to switch between the operating test modes depending on an internal states of the TAP controller.

2. The circuit according to claim 1, wherein the integrated circuit is designed to switch between the operating test modes when the TAP controller assumes at least two predefinable internal states.

3. The circuit according to claim 1, wherein the integrated circuit has an additional JTAG interface connected to the JTAG interface of the TAP controller for applying and picking up JTAG signals and is designed to operate the test unit in a specific operating test mode when JTAG signals assigned to the specific operating test mode are applied at the additional JTAG interface.

4. The circuit according to claim 1, wherein the test unit has a multiplexer connected to the functional units and the terminals of the integrated circuit for controllable connection of the specific circuit points of the functional units to the terminals.

5. The circuit according to claim 4, further comprising a control unit connected to the multiplexer and the TAP controller for driving the multiplexer depending on the internal states of the TAP controller.

6. The circuit according to claim 5, wherein the control unit is designed to receive the internal states of the TAP controller, to load and save a bit sequence assigned to a desired operating test mode, and to control the multiplexer with the stored bit sequence.

7. The circuit according to claim 6, wherein the control unit is designed to load the bit sequence when one of two predefinable states is received.

8. The circuit according to claim 7, wherein the TAP controller has a state machine with a number of internal states.

9. The circuit according to claim 5, wherein the control unit has a mode register, connected to the multiplexer, for storing a bit sequence assigned to a desired operating test mode.

10. The circuit according to claim 9, wherein the control unit has a shift register connected to the mode register for loading the bit sequence.

11. The circuit according to any claim 5, wherein the control unit has a decoder connected to the TAP controller for receiving the internal states of the TAP controller.

12. The circuit according to claim 1, wherein the integrated circuit has a microcontroller for controlling the functional units.

13. The circuit according to claim 12, wherein the microcontroller comprises the TAP controller.

14. The circuit according to claim 1, wherein at least one functional unit is designed as a memory unit, interface unit, a voltage monitoring unit, a decoder, an arbiter, or as an analogous unit.

15. A receiving device for a data transmission system comprising at least one integrated circuit according to claim 1.

16. The receiving device according to claim 15 wherein the receiving device is designed for satellite-supported position sensing.

17. The circuit according to claim 1, wherein the TAP controller functions according to IEEE 1149.

* * * * *